(12) United States Patent
Carelli, Jr. et al.

(10) Patent No.: US 7,584,439 B2
(45) Date of Patent: Sep. 1, 2009

(54) CELL MODELING FOR INTEGRATED CIRCUIT DESIGN WITH CHARACTERIZATION OF UPSTREAM DRIVER STRENGTH

(75) Inventors: John A. Carelli, Jr., Allentown, PA (US); Fan Zhou, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 330 days.

(21) Appl. No.: 11/567,986

(22) Filed: Dec. 7, 2006

(65) Prior Publication Data

US 2008/0140377 A1 Jun. 12, 2008

(51) Int. Cl.
*G06F 17/50* (2006.01)

(52) U.S. Cl. .................................. 716/5; 716/4; 716/6

(58) Field of Classification Search ............ 716/4–6
See application file for complete search history.

(56) References Cited

U.S. PATENT DOCUMENTS

| | | | |
|---|---|---|---|
| 5,692,160 A | 11/1997 | Sarin | |
| 5,903,466 A * | 5/1999 | Beausang et al. | 716/18 |
| 6,028,995 A | 2/2000 | Jetton et al. | |
| 6,090,152 A | 7/2000 | Hayes et al. | |
| 6,272,664 B1 | 8/2001 | Chang et al. | |
| 6,771,126 B2 * | 8/2004 | Blankenship et al. | 330/257 |
| 7,003,741 B2 * | 2/2006 | Srinivasan | 716/2 |
| 7,389,488 B2 * | 6/2008 | Chen et al. | 716/17 |
| 2004/0194043 A1 * | 9/2004 | Sundar et al. | 716/5 |

OTHER PUBLICATIONS

F. Wang et al., "Scalable Polynomial Delay Model for Logic and Physical Synthesis," Synopsys Inc., 6 pages, 2000.
"Accurate Multi-Voltage Delay Analysis," Cadence Technical Paper, Cadence Design Systems, Inc., 8 pages, 2004.
U.S. Appl. No. 11/187,455, filed Jul. 22, 2005, John A. Carelli, Jr., "Multi-Variable Polynomal Modeling Techniques for Use in Integrated Circuit Design."

* cited by examiner

*Primary Examiner*—Vuthe Siek
(74) *Attorney, Agent, or Firm*—Ryan, Mason & Lewis, LLP

(57) ABSTRACT

A cell is modeled for use in an integrated circuit design by characterizing the cell based on an input of the cell being driven by a characterization driver having a specified drive strength. A model of the cell is generated which stores an identifier of the characterization driver in association with an identifier of the input. The cell model is then utilized to determine if an actual driver of the input of the cell in the integrated circuit design has a drive strength which is less than that of the characterization driver, and if the actual driver has a drive strength which is less than that of the characterization driver an indicator of this condition is generated. The indicator may, for example, prompt selection of a different driver to replace the actual driver in the integrated circuit design.

20 Claims, 3 Drawing Sheets

CELL MODELING FOR INTEGRATED CIRCUIT DESIGN WITH CHARACTERIZATION OF UPSTREAM DRIVER STRENGTH

FIELD OF THE INVENTION

The present invention relates to the field of integrated circuit design and, more specifically, to techniques for modeling of cell propagation delay, output voltage slew, timing constraints, power consumption, capacitive load or other cell information in cell-based integrated circuit design.

BACKGROUND OF THE INVENTION

The computer-aided design of an integrated circuit typically involves interconnecting various building blocks, commonly referred to as cells, which perform specified circuit functions. Such cells may correspond, for example, to particular predetermined arrangements of one or more logic gates, flip-flops, latches, etc. In order to determine if the overall circuit meets timing requirements, it is important to have accurate models of signal propagation delay through each of the cells. Other types of cell information, including, for example, output voltage slew, timing constraints such as setup and hold times, power consumption, and capacitive load, can also be modeled. Such models also help the designer optimize circuit performance while avoiding metastable conditions.

In an example of typical conventional practice, the cell propagation delay is modeled as a function of at least two independent variables, such as input voltage slew and output capacitive load. In one approach of this type, delay measurements are obtained, using circuit simulation software such as SPICE, for different values of input voltage slew and output capacitive load. The measured data points are stored in a two-dimensional (2D) table indexed by the particular input voltage slew and output capacitive load values used to obtain those data points. In order to determine the cell delay at other input voltage slew or output capacitive load values, linear interpolation between the measured data points is used.

Another example of conventional practice involves storing SPICE extracted output current or voltage waveforms, rather than explicit delay and output slew values. These waveforms, also arrayed in input slew and output load dependent tables, are taken directly into an analysis tool. The analysis tool then calculates more accurate delays and output slews using sophisticated interpolation and integration techniques.

It is also known to fit the delay measurement data to a multi-variable polynomial model. The polynomial model can then be evaluated at any input voltage slew and output capacitive load values in order to obtain the corresponding delay. Examples of polynomial modeling techniques of this type are disclosed in F. Wang et al., "Scalable Polynomial Delay Model for Logic and Physical Synthesis," Synopsys Inc., 2000, and U.S. Pat. No. 6,272,664, entitled "System and Method for Using Scalable Polynomials to Translate a Look-Up Table Delay Model into a Memory Efficient Model," both incorporated by reference herein. Polynomial models can also be configured to incorporate additional independent variables, such as supply voltage and temperature.

U.S. patent application Ser. No. 11/187,455, filed Jul. 22, 2005 and entitled "Multi-Variable Polynomial Modeling Techniques for Use in Integrated Circuit Design," which is commonly assigned herewith and incorporated by reference herein, discloses an improved polynomial modeling technique that provides a higher level of accuracy than the above-noted conventional techniques, without significantly increasing the complexity of the modeling process and its associated computation and storage requirements.

Despite the advances provided by the modeling techniques disclosed in the above-cited patent application, a need remains for further improvements. For example, certain basic assumptions of typical cell modeling techniques, particularly with regard to upstream driver strength, can limit the accuracy of the resulting models. This issue is of primary concern for certain types of circuit elements, such as transmission gates or pass gates. The modeling deficiencies relating to such elements may result in the corresponding integrated circuit failing to operate as intended.

SUMMARY OF THE INVENTION

The present invention in an illustrative embodiment meets the above-noted need by providing improved techniques for modeling a cell for use in an integrated circuit design.

In one aspect of the invention, a transmission gate cell or other type of cell is modeled for use in an integrated circuit design by characterizing the cell based on an input of the cell being driven by a characterization driver having a specified drive strength. A model of the cell is generated which stores an identifier of the characterization driver in association with an identifier of the input. The cell model is then utilized to determine if an actual driver of the input of the cell in the integrated circuit design has a drive strength which is less than that of the characterization driver, and if the actual driver has a drive strength which is less than that of the characterization driver an indicator of this condition is generated. The indicator may simply comprise a visible or audible warning provided to the designer via a display or other output device of a data processing system. Alternatively or additionally, the indicator may prompt selection of a different driver to replace the actual driver in the integrated circuit design. More particularly, a prompt of this type may be configured so as to provide the designer with an option to select from one or more specified alternative drivers to replace the previous actual driver in the design.

The drive strengths of the characterization driver and the actual driver may be specified, for example, in terms of respective maximum drive capacitances. Such maximum drive capacitances may be determined during characterization processes for respective driver cells as capacitance values needed to obtain a given target output slew. As another example, the drive strengths of the characterization driver and the actual driver may be specified in terms of respective maximum current sourcing capabilities.

The drive strengths of the characterization driver and the actual driver may comprise apportioned drive strengths which represent respective portions of total drive strengths of the respective drivers that are apportioned to the input of the cell. For example, if more than one cell input is being driven by a given driver in the integrated circuit design, the drive strength of the given driver may be apportioned among the inputs that it drives and the apportioned drive strength may be used in determining if the actual driver of a given input of the cell has a drive strength which is less than that of the characterization driver. The drive strength of the given driver may be apportioned among the inputs that it drives according to their respective fractions of total input capacitance driven by the given driver, or using other techniques.

The modeling techniques in an illustrative embodiment overcome the above-described disadvantages of conventional practice. For example, such techniques can provide improved modeling accuracy, particularly for portions of the modeling space in which cell performance is a function of upstream driver strength. Moreover, this enhanced accuracy is provided without significantly increasing the amount of computation and memory resources that are consumed in generating the models or in utilizing the models to perform timing analysis or other processing on an integrated circuit design.

DETAILED DESCRIPTION OF THE INVENTION

The present invention will be described herein in conjunction with illustrative embodiments of a data processing system and associated modeling techniques. It should be understood, however, that the invention is not limited to the illustrative embodiments presented herein. Numerous modifications of the illustrative embodiments will be readily apparent to those skilled in the art.

Figure 1:
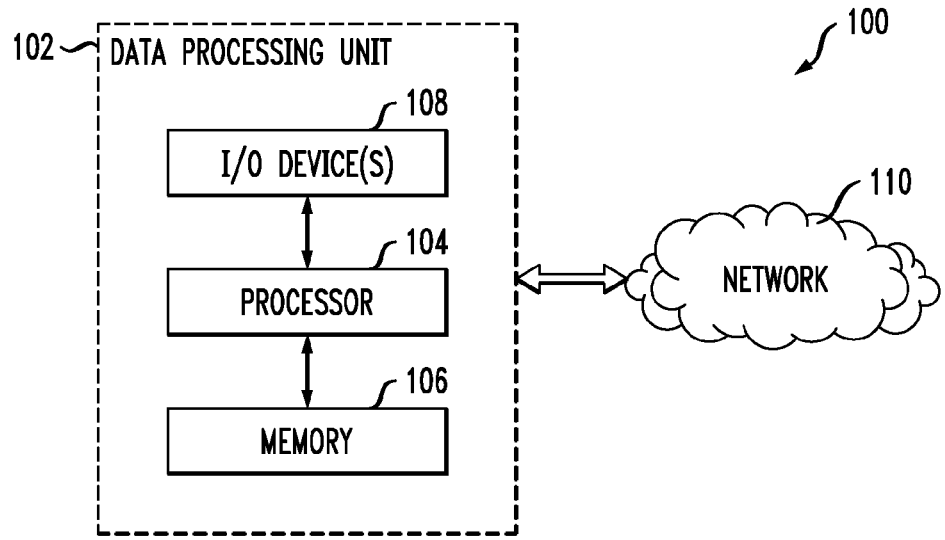
FIG. 1 is a block diagram of a data processing system which incorporates a cell modeling technique in an illustrative embodiment of the invention.

FIG. 1 shows a data processing system 100 which implements a cell modeling technique in an illustrative embodiment of the invention. As will be described, this cell modeling technique provides a cell model that takes upstream drive strength into account. The system 100 comprises a data processing unit 102 which includes a processor 104, a memory 106, and one or more input/output (I/O) devices 108, interconnected as shown. The data processing unit 102 in this embodiment is coupled to a network 110, although in other embodiments need not be connected to a network. One or more software programs for integrated circuit design using cell modeling are stored in memory 106 of data processing unit 102, and executed by the processor 104 of data processing unit 102.

The data processing unit 102 may comprise, for example, a computer, a workstation, a computer-aided design (CAD) terminal, or other processor-based device configured to implement at least a portion of a cell modeling technique as described below. The conventional aspects of such devices are well known to those skilled in the art and will therefore not be further described herein.

A designer may interact with the data processing unit 102 through one or more display monitors, keyboards, computer pointing devices, etc. The interaction preferably occurs via a graphical user interface. The connection with network 110 allows the data processing unit 102 to access files and data external to itself. Of course, this particular configuration is presented by way of example only, and numerous alternative configurations may be used in implementing the invention.

Figure 2:
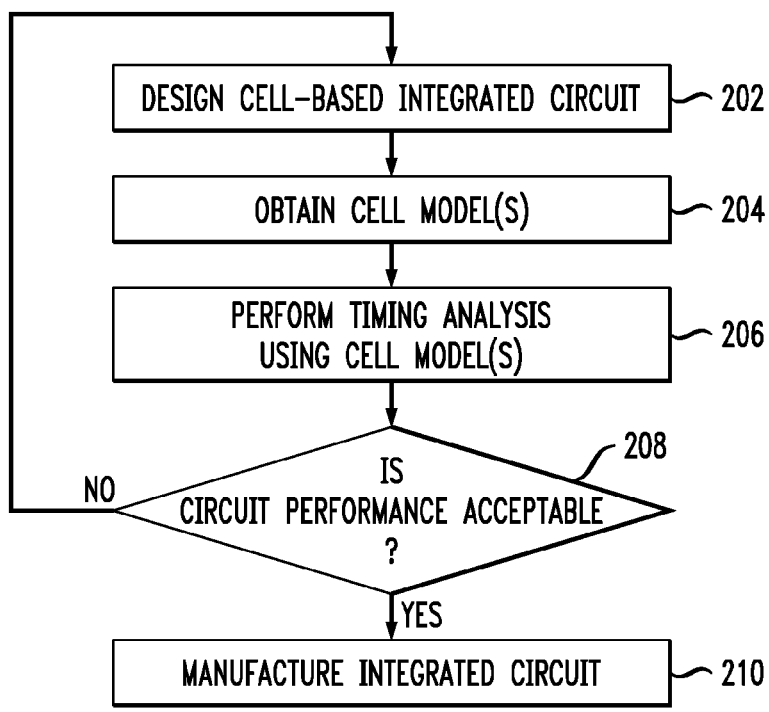
FIG. 2 is a flow diagram of an exemplary integrated circuit design process that may be implemented at least in part in the data processing system of FIG. 1.

FIG. 2 shows a flow diagram 200 of an integrated circuit design process that may be implemented at least in part in the data processing system 100 of FIG. 1.

In step 202, a designer designs a cell-based integrated circuit using circuit design software running on the data processing unit 102. As indicated previously herein, such a design process typically involves interconnecting various building blocks, commonly referred to as cells, which perform specified circuit functions. Such cells may correspond, for example, to particular predetermined arrangements of one or more logic gates, flip-flops, latches, etc. A more particular example of one such cell, corresponding to a transmission gate, will be described in greater detail below with reference to FIG. 3A. The present invention is not restricted to use with any particular type or types of cell models. For example, multi-variable polynomial cell models may be used, of the type described in the above-cited U.S. patent application Ser. No. 11/187,455.

Once the initial design is complete, one or more cell models are obtained in step 204, and timing analysis is performed using the cell model(s) in step 206. Other types of processing of the integrated circuit design using the cell model(s) may be used in place of the timing analysis of step 206, as will be appreciated by those skilled in the art. A given cell model may be obtained using the process to be described below in conjunction with FIG. 4. In one possible implementation, a given cell model can be generated by the data processing unit 102 as needed. In other embodiments, one or more cell models may be generated in the manner shown in FIG. 4 but on a different computer or other processing device, and subsequently supplied to the data processing unit 102 via network 110 as needed. As another alternative, one or more cell models may be generated in the manner shown in FIG. 4 using data processing unit 102 or a different computer or other processing device, and then stored in a file system of the memory 106 so as to be available for access in step 204. The timing analysis in step 206 may be performed using conventional techniques.

The design process 200 is iterative, and thus if the circuit performance is determined in step 208 to be unacceptable, the process returns to step 202 such that the design can be adjusted. Steps 204 and 206 are then repeated for the adjusted design. This iterative process continues until the circuit performance is acceptable, at which point the integrated circuit design can be manufactured as indicated in step 210.

It is to be appreciated that the particular steps of the FIG. 2 process are greatly simplified for clarity of illustration, and numerous additional or alternative steps of a conventional nature may be incorporated into a given embodiment of such a process.

As noted above, conventional cell modeling techniques make certain basic assumptions that can limit the accuracy of the resulting model. We have determined that one such assumption that is particularly problematic for modeling of certain types of cells, such as cells comprising transmission gates or pass gates, is that the modeled cell propagation delay is independent of the driving strength of the upstream driver which drives a secondary pin not actively involved in the delay being measured.

This assumption is based on the fact that most upstream drivers of a given cell drive the gates of transistors, such that the charging of any internal nodes, as well as the outputs of the cell, only depends upon transistors local to that cell. That is, the upstream driver that is driving a secondary pin of a given cell only needs to hold the charge on the capacitance of that pin and, thus, the output switching does not depend directly on the drive capability of the upstream driver. Accordingly, conventional modeling techniques usually characterize the drivers of the secondary input pins as ideal voltage sources, that is, as sources having infinite current sourcing capability, or as high-drive drivers, such as the highest drive buffer available in the corresponding cell library. These ideal voltage sources or high-drive drivers are used to hold secondary input pins in their desired voltage states while a primary input pin is switched for a given timing arc being measured. Normally, this approach works well, as all that is required of any upstream driver driving such a secondary pin is that it hold the charge on the gates of the transistors at that input node.

However, in cells which comprise transmission gates or pass gates, the above-described assumption is no longer valid. For such cells, when a primary input pin is switched, the charge on both the internal cell nodes and the cell outputs depends directly upon the strength of the upstream drivers which drive the secondary pins. Thus, the conventional use of ideal voltage sources or high-drive drivers in the modeling of such cells can lead to inaccurate cell models and possible design problems.

The present invention in an illustrative embodiment provides improved modeling of cells comprising transmission gates or pass gates by taking upstream driver strength into account in the modeling process. In this embodiment, a cell model is generated based on an upstream driver of known drive strength, referred to as a characterization driver. Information about this characterization driver is stored with the model and used at circuit analysis time in step 206 of FIG. 2 as part of an audit to determine that the cell is not actually being driven by a weaker upstream driver cell, which would compromise the delay beyond what is accounted for in the modeling.

Figure 3A:
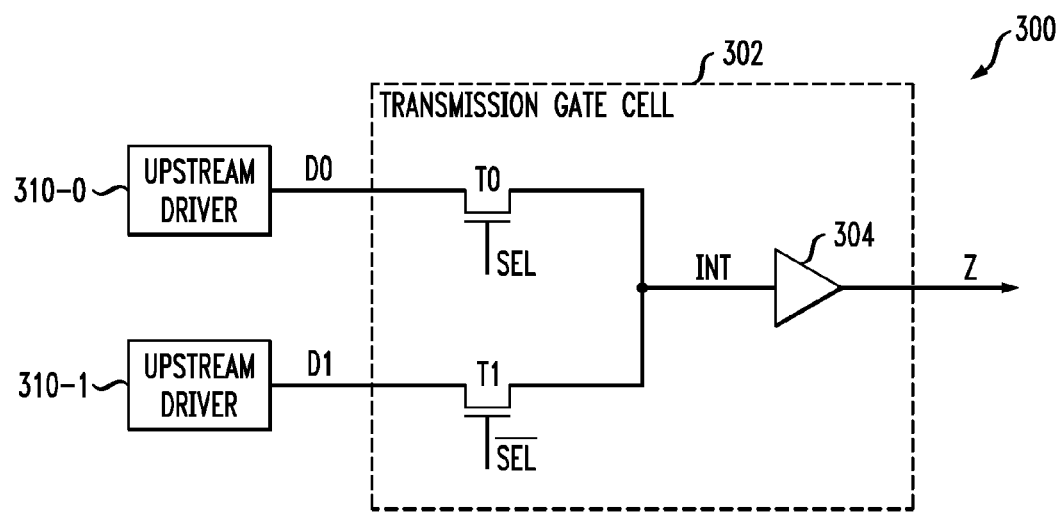
FIG. 3A shows an example of a transmission gate cell that may be modeled for use in the design process of FIG. 2.

FIG. 3A shows an example of a circuit 300 comprising a transmission gate cell 302 that may be modeled in the manner described above. This particular transmission gate cell, which is a two-input multiplexer, includes transistors T0 and T1 and a buffer 304. The transmission gate cell further includes secondary input pins denoted D0 and D1, which are driven by respective upstream drivers 310-0 and 310-1. A primary input pin of the cell 302 is a control pin that supplies a select signal denoted SEL. The gate of transistor T0 is driven by the select signal SEL, and the gate of transistor T1 is driven by the complement of the select signal, which is denoted SEL-BAR.

Figure 3B:
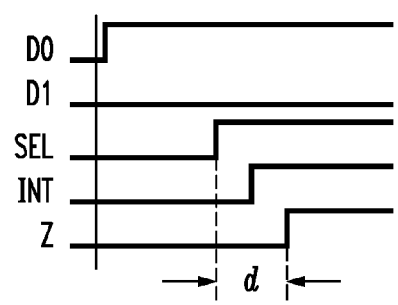
FIG. 3B is a timing diagram showing the operation of the transmission gate cell of FIG. 3A.

In this example, the transmission gate cell 302 selects one of the inputs D0 or D1 for propagation to the output Z based on the state of the select signal SEL. With reference to the timing diagram of FIG. 3B, it can be seen that input D0 transitions from a low to a high logic level prior to a similar transition in the select signal SEL. After the SEL signal transitions from low to high, internal node INT transitions from low to high, and subsequently the output Z transitions from low to high. There is a propagation delay d between the transition in the select signal SEL and the corresponding transition in the output Z. Thus, as part of the modeling of the cell 302, the primary input pin providing the select signal SEL is switched so as to measure a timing arc represented by the propagation delay d.

As indicated above, conventional cell modeling practice generally assumes that the secondary inputs such as those associated with D0 and D1 in the FIG. 3A example are driven by ideal voltage sources or high-drive drivers. However, this leads to inaccuracy, because the time it takes for the internal node ANT to charge will depend not only on the transistor T0 but also to a large extent on the drive strength of the upstream driver 310-0. Measuring the propagation delay d assuming that the D0 input pin is driven by an ideal voltage source or high-drive driver leads to a delay measurement that is optimistic with respect to the delay in the presence of an actual upstream driver 310-0 driving the D0 input pin.

The illustrative embodiment overcomes this problem of conventional practice by characterizing the cell 302 using characterization drivers having specified drive strengths, and storing identifiers of the characterization drivers with the cell model. Thus, in the foregoing example, when measuring the propagation delay d, the D0 input pin is no longer simply assumed to be an ideal voltage source or a high-drive driver, but is instead defined as a particular characterization driver having specified drive strength, with an identifier of that characterization driver being stored with the cell model. For example, the characterization driver may be a buffer selected from the same cell library as the transmission gate cell 302 being characterized. A similar approach is used when characterizing operation of the cell 302 with respect to the secondary input D1.

For each of the secondary input pins D0 and D1 in the present example, a name or other identifier of the particular upstream driver used to drive that pin during characterization is stored for future reference in the cell model.

When cells modeled as described above are used in a circuit design generated in step 202 of FIG. 2, the drive strengths of the actual upstream drivers in the circuit design may be compared to the drive strengths of the corresponding characterization drivers as specified by the cell models. An audit of this type may be performed, for example, as part of one or more of the steps 204, 206 or 208 of the FIG. 2 process, or as a separate step in that process. If a given actual upstream driver has a drive strength which is less than that of the characterization driver used in the cell model, a warning or other indicator may be issued. The designer can then increase the drive strength of the upstream driver by, for example, selecting a different upstream driver in the circuit design. In this way, the output delay in the cell as used in the circuit design will never be greater than that of the associated cell model.

Figure 4:
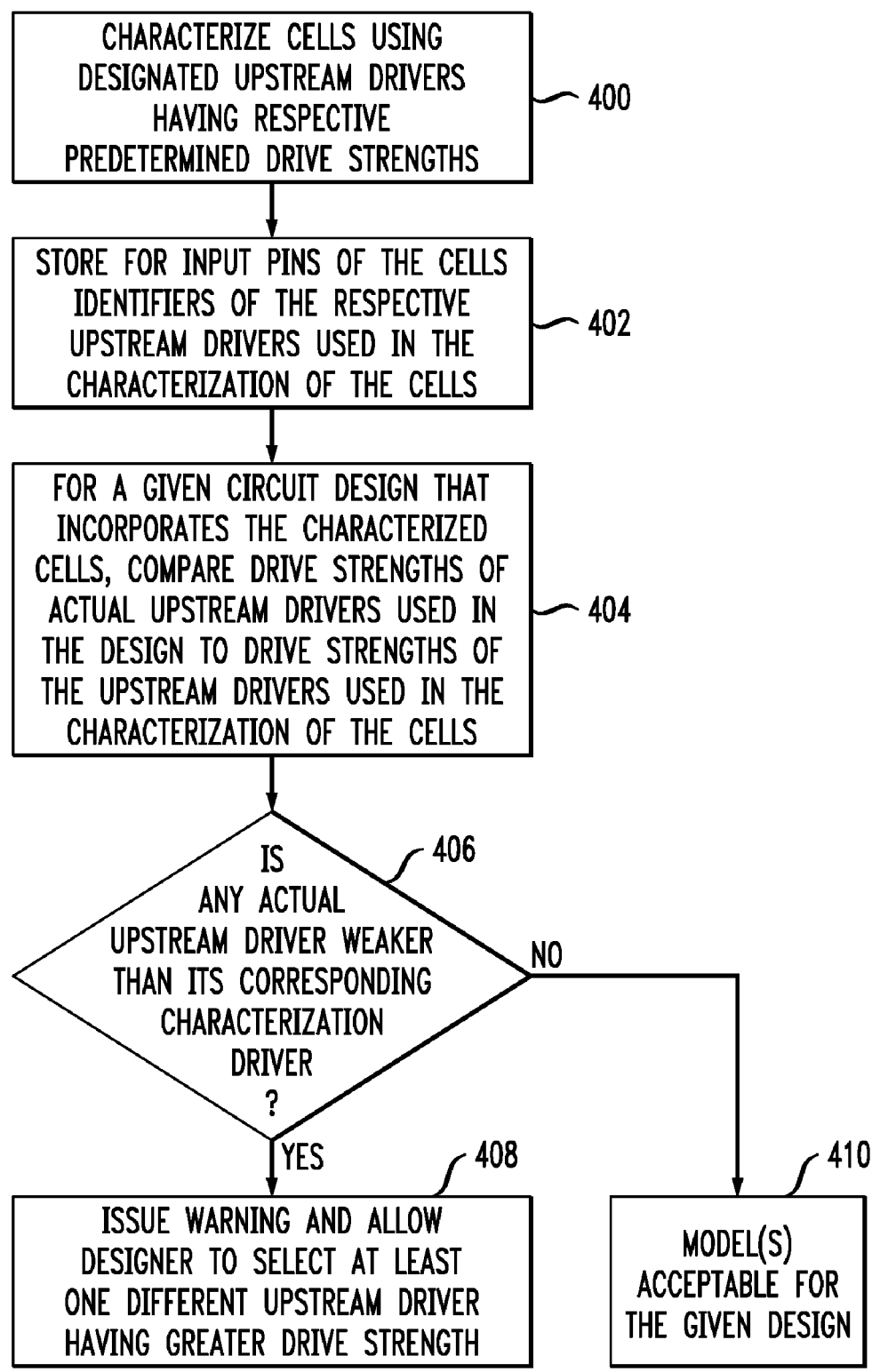
FIG. 4 is a flow diagram of an exemplary cell modeling technique that is implementable in the system of FIG. 1.

Referring now to FIG. 4, a flow diagram shows how a given cell model can be generated in an illustrative embodiment of the invention. Such a cell model, once generated, can be utilized in one or more steps of the FIG. 2 process. As noted above, the given cell model can be generated as needed, or generated prior to need and stored in data processing unit 102 or in another memory accessible over the network 110.

The particular model generated in the FIG. 4 process is assumed to be for a cell utilizable as a design element in step 202 of FIG. 2. Such a cell need not have any particular structure or functionality, and may comprise, for example, a transmission gate such as that shown in FIG. 3A, or another type of transmission gate or pass gate. Other types of cells may be used, corresponding to, for example, a logic gate, a flip-flop, a latch, etc. as well as combinations of such elements. Thus, the present invention is not restricted to use with any particular types of gates or other circuit elements.

In step 400 of FIG. 4, cells are characterized using designated upstream drivers having respective predetermined drive strengths. As noted above, such upstream drivers may comprise buffers or other types of cells selected from the same cell libraries as the respective characterized cells. The process in step 402 stores, for particular input pins of the cells, identifiers of the respective upstream drivers used in characterization of the cells. Although these and other steps of the FIG. 4 process refer to multiple cells and multiple input pins, the process can of course be applied to only a single secondary input pin of one particular cell.

A cell model generated in the manner described above may therefore include a stored attribute or other identifier associated with each pin for which an upstream driver was used. For example, such an attribute may be called "tgdriver_cell" and will have as its value the name of the driver cell used in the characterization. Numerous other types of identifiers of cell inputs and their associated characterization drivers may be used. The identifier of a given characterization driver may be stored in association with a given input using any technique which allows subsequent determination of the particular driver that was used to drive that input when the cell was characterized for purposes of generating a cell model.

For a given circuit design that incorporates cells characterized as described above, the drive strengths of the actual upstream drivers used in the design are compared to the drive strengths of the upstream drivers used in the characterization of the cells, as indicated in step 404. This comparison may be in the form of audit of any characterized cells, as indicated previously. The audit may be performed on each cell model individually as the models are obtained in, for example, step 204 of the FIG. 2 process. As another example, an audit may be applied after a fill set of models is obtained in step 204.

There are many different ways in which the drive strengths of the actual driver and the characterization driver can be compared. For example, one can compare the maximum capacitances that the two drivers can drive. These values are usually determined during the characterization process for the corresponding cells and may be the capacitance values needed to obtain a given target output slew. More specifically, a maximum capacitance value may be derived during the characterization process by measuring the output transition time for a cell for a given load. The load is then iterated until the maximum transition time matches a target transition time. If all of the cells in a given cell library use the same target transition time in the extract of their maximum capacitance values, then comparing their respective maximum capacitance values would be a valid indicator of their relative drive strengths.

As another example, one can compare the maximum current that can be sourced by the two drivers. A variety of other conventional measures of drive strength may be used, as will be apparent to those skilled in the art.

Step 406 determines if any actual upstream driver is weaker than its corresponding characterization driver. If there is at least one such driver, the process issues a warning as shown in step 408 and allows the designer to select a different upstream driver having a greater drive strength than the previously-selected upstream driver. Otherwise, the model or set of models is confirmed as acceptable for the given design, as indicated in step 410.

The warning issued in step 408 is an example of what is more generally referred to herein as an "indicator." Such an indicator may comprise a visible or audible warning provided to the designer via a display or other output device of unit 102 in data processing system 100 of FIG. 1. Alternatively or additionally, the indicator may prompt selection of a different driver to replace the actual driver in the integrated circuit design. A prompt of this type may be configured, by way of example, so as to provide the designer with an option to select from one or more specified alternative drivers to replace the previously-selected upstream driver in the given circuit design. Numerous other types of indicators may be used to make a designer aware of the fact that a selected upstream driver has a drive strength that is less than that of the characterization driver used in generating the cell model.

It is to be appreciated that the particular processing steps shown and described in conjunction with the flow diagram of FIG. 4 are presented by way of illustrative example only, and alternative embodiments may alter the processing steps, include additional steps, use only a subset of the steps, etc.

Again, although described in the context of multiple cells, the FIG. 4 process can be adapted in a straightforward manner to operate with only a single cell having only a single secondary input pin for which an upstream driver identifier is stored.

Advantageously, the cell modeling technique of the FIG. 4 embodiment provides improved modeling accuracy, particularly for transmission gates and other cells having delays that are a function of upstream drive strength. It provides this enhanced accuracy without significantly increasing the amount of computation and memory resources that are consumed in generating the models or in utilizing the models to perform timing analysis or other processing on an integrated circuit design.

More specifically, the FIG. 4 process can be implemented through a modest addition to existing characterization techniques to introduce the secondary pin driver and include that information in the cell model. It can be readily implemented in existing cell modeling tools. Similarly, existing timing analysis techniques can continue to be used without significant change. In addition, a driver strength audit of the type described above can be implemented in the design process in a straightforward manner.

As noted above, one way to compare the drive strengths of the characterization and actual drivers in the FIG. 4 process is to compare their maximum drive capacitance values. This process will now be described in greater detail.

In a scenario in which there is only one transmission gate cell being driven by a given driver cell, the previously-described audit may involve simply comparing the maximum capacitance values of the respective characterization and actual drivers. If the maximum capacitance value of the actual driver is less than that of the characterization driver, the designer may be prompted to substitute in a driver with a maximum capacitance value greater than or equal to that of the characterization driver.

However, if more than one transmission gate cell pin is being driven by a given upstream driver, one should first apportion the drive strength of the upstream driver among the transmission gate cell pins that it drives before making the above-described comparison. For example, one can use the input pin capacitance of the transmission gate cell(s) to apportion the drive strength of the upstream driver among the cell pins that it drives. The maximum capacitance value of the upstream driver is thus divided up among the cell pins according to what fraction of the total pin capacitance each input pin represents. The audit is then performed as described above using the apportioned maximum capacitance value.

As indicated previously, the present invention in the illustrative embodiments may be implemented at least in part in the form of one or more software programs that are stored in an electronic memory, on a magnetic or optical disk, or in another type of storage device. Such software may be stored and executed in the data processing unit 102 of FIG. 1, as previously indicated.

In manufacturing integrated circuits designed using the techniques of the illustrative embodiments, identical die are typically formed in a repeated manner on a surface of a semiconductor wafer. Each die includes one or more devices corresponding to cells of the type described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It should again be emphasized that the above-described embodiments of the invention are intended to be illustrative only. No limitation with respect to the specific embodiments described herein is intended or should be inferred. Other embodiments can use different types and arrangements of elements for implementing the described functionality. For example, the particular types of cells, cell information and cell models used in the modeling process, as well as the manner in which upstream drive strength is indicated or otherwise associated with a given cell or cells, may be varied to accommodate the particular needs of a given application. These and numerous other alternative embodiments within the scope of the following claims will be apparent to one skilled in the art.

What is claimed is:

1. A processor-implemented method of modeling a cell for use in an integrated circuit design, the method comprising the steps of:
    characterizing the cell based on an input of the cell being driven by a characterization driver having a specified drive strength; and
    generating a model of the cell which stores an identifier of the characterization driver in association with an identifier of the input;
    wherein the cell model is utilized to determine if an actual driver of the input of the cell in the integrated circuit design has a drive strength which is less than that of the characterization driver, and if the actual driver has a drive strength which is less than that of the characterization driver, an indicator of this condition is generated; and
    wherein an interface is provided to allow an alternative driver to be selected responsive to the indicator.

2. The method of claim 1 wherein the indicator prompts selection of a different driver to replace the actual driver in the integrated circuit design.

3. The method of claim 2 wherein the generation of the indicator further comprises providing an option to select the different driver.

4. The method of claim 1 wherein the cell comprises a transmission gate having at least first and second data signal inputs and a select signal input.

5. The method of claim 1 wherein the drive strengths of the characterization driver and the actual driver are specified in terms of respective maximum drive capacitances.

6. The method of claim 5 wherein the maximum drive capacitances are determined during characterization processes for respective driver cells as capacitance values needed to obtain a given target output slew.

7. The method of claim 1 wherein the drive strengths of the characterization driver and the actual driver are specified in terms of respective maximum current sourcing capabilities.

8. The method of claim 1 wherein the drive strengths of the characterization driver and the actual driver comprise apportioned drive strengths which represent respective portions of total drive strengths of the respective drivers that are apportioned to the input of the cell.

9. The method of claim 1 wherein the characterization driver and the actual driver are characterized by respective driver cell models.

10. The method of claim 1 wherein the characterization driver and the actual driver comprise driver cells selected from a cell library which includes the cell for which the cell model is generated.

11. The method of claim 1 wherein if more than one cell input is being driven by a given driver in the integrated circuit design, the drive strength of the given driver is apportioned among the inputs that it drives and the apportioned drive strength is used in determining if the actual driver of a given input of the cell has a drive strength which is less than that of the characterization driver.

12. The method of claim 11 wherein the drive strength of the given driver is apportioned among the inputs that it drives according to their respective fractions of total input capacitance driven by the given driver.

13. The method of claim 1 wherein the cell model comprises a multi-variable polynomial model.

14. The method of claim 1 wherein the steps are implemented in software running on a processing device comprising a memory and a processor coupled to the memory.

15. An article of manufacture comprising a storage medium storing one or more software programs which, when executed by a processing device, perform the steps of the method of claim 1.

16. A processor-implemented method for generating an integrated circuit design, the method comprising the steps of:
    incorporating a cell in the design, the cell being represented by a cell model which characterizes the cell based on an input of the cell being driven by a characterization driver having a specified drive strength, the cell model storing an identifier of the characterization driver in association with an identifier of the input;
    determining if an actual driver of the input of the cell in the integrated circuit design has a drive strength which is less than that of the characterization driver; and
    providing an output indicator based on a result of the determining step; and
    providing an interface to allow an alternative driver to be selected responsive to the output indicator.

17. An apparatus for modeling a cell for use in an integrated circuit design, the apparatus comprising a processing device, the processing device comprising a processor and a memory, the processor being coupled to the memory, the processing device being configured to implement the steps of the method of claim 16.

18. An apparatus for modeling a cell for use in an integrated circuit design, the apparatus comprising:
    a processing device, the processing device comprising a processor and a memory, the processor being coupled to the memory;
    the processing device being configured:
    to characterize the cell based on an input of the cell being driven by a characterization driver having a specified drive strength; and
    to generate a model of the cell which stores an identifier of the characterization driver in association with an identifier of the input;
    wherein the cell model is utilized to determine if an actual driver of the input of the cell in the integrated circuit design has a drive strength which is less than that of the characterization driver, and if the actual driver has a drive strength which is less than that of the characterization driver, an indicator of this condition is generated; and
    wherein an interface is provided to allow an alternative driver to be selected responsive to the indicator.

19. The apparatus of claim 18 wherein the processing device is further utilized to generate at least a portion of the integrated circuit design and to generate the indicator of the condition.

20. The apparatus of claim 18 wherein the integrated circuit design and the indicator of the condition are generated on a different processing device.

* * * * *